US005545918A

United States Patent [19]
Dos Santos, Jr. et al.

[11] Patent Number: 5,545,918
[45] Date of Patent: *Aug. 13, 1996

[54] CIRCUIT CONSTRUCTION FOR CONTROLLING SATURATION OF A TRANSISTOR

[75] Inventors: Francisco Dos Santos, Jr., Nashua, N.H.; Larry M. DeVito, Tewksbury, Mass.

[73] Assignee: Analog Devices, Inc., Norwood, Mass.

[ * ] Notice: The term of this patent shall not extend beyond the expiration date of Pat. No. 5,418,386.

[21] Appl. No.: 404,238

[22] Filed: Mar. 15, 1995

Related U.S. Application Data

[63] Continuation of Ser. No. 281,521, Jul. 25, 1994, Pat. No. 5,418,386, which is a continuation of Ser. No. 847,281, Mar. 10, 1992, abandoned.

[51] Int. Cl.$^6$ .................. H01L 27/082; H01L 27/102; H01L 29/70; H01L 31/11
[52] U.S. Cl. ............ 257/577; 257/553; 257/556; 257/560; 257/562; 257/564; 257/566; 327/561; 327/575; 327/576; 327/578
[58] Field of Search ............ 257/552, 553, 257/556, 560, 561, 562, 564, 565, 566, 573, 577, 588, 591, 592; 307/491, 493, 270, 313; 327/561, 575, 576, 578

[56] References Cited

U.S. PATENT DOCUMENTS

| | | | |
|---|---|---|---|
| 3,609,413 | 9/1971 | Lane et al. | 257/552 |
| 4,826,780 | 6/1989 | Takemato et al. | 257/556 |
| 4,969,823 | 11/1990 | Lapham et al. | 437/31 |
| 4,980,576 | 12/1990 | Rossi et al. | 307/270 |
| 5,027,004 | 6/1991 | Polara | 307/270 |
| 5,065,214 | 11/1991 | Lapham et al. | 357/43 |
| 5,172,018 | 12/1992 | Colandrea et al. | 307/270 |
| 5,179,432 | 1/1993 | Husher | 257/552 |
| 5,418,386 | 5/1995 | Dos Santos, Jr. et al. | 257/566 |

FOREIGN PATENT DOCUMENTS 0313526  4/1989  European Pat. Off. .

*Primary Examiner*—Ngân V. Ngô
*Attorney, Agent, or Firm*—Wolf, Greenfield & Sacks, P.C.

[57] ABSTRACT

An integrated circuit including a semiconductor substrate, a semiconductor layer formed on the substrate, a desired bipolar transistor formed in the semiconductor layer. First and second parasitic elements are formed in the integrated circuit. An element is provided which detects when the second parasitic element becomes active or which prevents increase of the collector-to-emitter voltage of the desired bipolar transistor in response to current flowing through the second parasitic transistor. This element may be a semiconductor region formed in the semiconductor layer. The transistor may be an npn or pnp type transistor manufactured according to a complementary bipolar process or other process which results in a transistor with first and second parasitic elements. The present invention is also well-suited for use in the output stage of an operational amplifier. The element which detects activity of the second parasitic transistor intercepts carriers flowing towards the junction isolation bands and substrate from the collector of the desired bipolar transistor.

13 Claims, 5 Drawing Sheets

CIRCUIT CONSTRUCTION FOR CONTROLLING SATURATION OF A TRANSISTOR

This application is a continuing application of Ser. No. 08/281,521, filed Jul. 25, 1994, now U.S. Pat. No. 5,418,386 which is a continuation application filed under 37 CFR 1.62 of prior application Ser. No. 07/847,281, filed Mar. 10, 1992, now abandoned.

FIELD OF THE INVENTION

This invention relates to integrated circuit constructions for controlling saturation of a transistor and methods for making such circuit constructions. More particularly, the present invention relates to constructions for controlling the saturation of a transistor fabricated using a complementary bipolar process.

BACKGROUND OF THE INVENTION

Bipolar transistors are often used in a state of saturation. In this state, in some integrated circuits, parasitic transistors become active and may cause undesirable effects in the operation of the principal transistor.

FIG. 1 illustrates a typical NPN transistor element 8 manufactured according to a complementary bipolar process. An example of such a circuit and a method for making it is disclosed in U.S. Pat. Nos. 4,969,823 and 5,065,214, which are hereby incorporated by reference. This transistor element is typically formed on an N-type substrate 10. On the substrate 10, a P-well 12 is formed. In the P-well 12, an N-type subcollector 16 is formed. An N-type region 14 is also formed to make part of a junction isolation band for isolating from one another multiple devices on an integrated circuit. A P-type epitaxial layer 13 is formed on the N-type region 16, P-well 12 and substrate 10. In the epitaxial layer 13, an N-type region 15 is formed to make the collector of the transistor. This region 15 extends to the N-type subcollector 16. A contact 11 is provided for this collector also. Another N-type region 17, extending to region 14 completes the junction isolation band. A P-type diffusion region 18 is formed in region 15 to form the base of the transistor. A contact 19 is also provided for the base. An N+type region 20 is formed in region 18 to make the emitter of the transistor.

Other processes and structures may result in an integrated circuit construction in which the present invention suitably may be used. Such structures include NPN or PNP transistors formed in P-type or N-type layers, respectively. These layers, for multiple circuit elements on an integrated circuit are isolated, respectively, by N-type or P-type junction isolation bands.

A conventional transistor such as shown in FIG. 1 may be understood schematically by the diagram of FIG. 2 where it will be seen to comprise a principal transistor 22 as well as two parasitic transistors 29 and 34. The parasitic transistors are undesired but are a consequence of the way the principal transistor is formed. The principal transistor 22 has as its base 23, region 18; as its collector 24, regions 15 and 16; and as its emitter, region 20. Each region has an associated parasitic resistance, modelled by the resistive elements bearing reference numerals 26, 27A and 27B, and 28, respectively. When the principal transistor 22 goes into saturation, a parasitic vertical PNP transistor (the first parasitic transistor) 29 becomes active. Its base 30 is formed by collector regions 15 and 16 (FIG. 1); its collector 31 is formed by the epitaxial layer 13 and P-well 12 (FIG. 1) and its emitter 32 is formed by base region 18 (FIG. 1). The collector of this parasitic transistor 29, i.e., P-type epitaxial layer 13 and P-well 12 (FIG. 1), has associated with it a parasitic resistance 33 (FIG. 2).

A second parasitic lateral NPN transistor 34 may also become active. Its base 35 is formed by the P-type epitaxial layer 13 and P-well 12 (FIG. 1); its collector 36 is the N-type substrate 10 and isolation bands 14 and 17 (FIG. 1); and its emitter 37 is the N-type collector regions 15 and 16 (FIG. 1).

A transistor having the structure as shown in FIG. 1 is often used in a circuit which may be understood schematically by the diagram of FIG. 3. The transistor element 8 is enclosed by an outline box in FIG. 3. This circuit further includes a transistor 38 having a collector 41 connected to a high potential supply (Vcc) rail 39, a base 40 for receiving a drive current $I_{DRIVE}$ from a current source 43, and an emitter 42 connected to provide a current $I_B$ to the base 23 of the principal transistor 22. A load resistor 44 is also provided and connected between the supply rail 39 and the collector 24 of the principal transistor 22, supplying current $I_{BIAS}$. A current source 46 is provided electrically in parallel with the base-emitter junction of the principal transistor 22. Both the emitter 25 and the P-type epitaxial layer 13 are connected to ground. The collector 36 of the second parasitic transistor 34 (formed by N-type substrate 10) is connected to supply rail 39 to receive the source voltage.

When the principal transistor 22 saturates, the first parasitic transistor 29 turns on. If, thereafter, the current $I_B$ driving the transistor element 8 is increased, the current flowing through the first parasitic transistor 29 increases. This current also flows through the parasitic resistance 33, causing the voltage across that resistance to increase. As this voltage increases, the voltage at the base 35 of the second parasitic transistor 34 eventually may become higher than the saturation voltage at the collector of the principal transistor 22 (which is also the emitter 37 of the second parasitic transistor 34) such that the base-to-emitter junction of transistor 34 becomes forward-biased. Thus, the second lateral parasitic transistor 34 may turn on. Because the collector 36 (i.e., the junction isolation bands 14, 17 and the substrate 10) of the second parasitic transistor must be connected to the supply rail 39 (to provide isolation), current then flows through the second parasitic transistor 34.

The carriers which flow through the second parasitic transistor 34 must be supplied to its emitter 37 via the collector of the principal transistor 22. The increased current through the parasitic resistance 28 and parasitic resistance 27A causes the collector-to-emitter voltage of transistor 22 to increase. The current in the second parasitic transistor 34 increases exponentially with an increase in current flowing through the parasitic resistance 33, which in turn increases approximately linearly with the current $I_B$ driving the base 23 of the principal transistor 22. Therefore, as the principal transistor 22 is driven deeper into saturation by a further increase in $I_B$, the collector-to-emitter voltage begins to increase substantially when the second parasitic transistor 34 turns on. This increase is known as phase inversion, and may have deleterious effects in a circuit, especially a feedback circuit. For instance, if a feedback system is designed to increase a drive current in response to an increase in $V_{CE}$ (in order to reduce $V_{CE}$), this system would work until phase inversion occurs. When phase inversion occurs, an increase in the drive current causes an increase in $V_{CE}$.

To verify that phase inversion occurs in the manner described, the test circuit of FIG. 4 (similar to the circuit of FIG. 3) was used. The results of a test of this circuit are shown in FIG. 5 and described below.

In FIG. 4, the base 23 of principal transistor 22 is driven by a current source 48 to provide base current $I_B$. $I_B$ was increased from 0 to 7 mA. $V_{CE}$ was measured with $I_{BIAS}$ set by current source 49 at, alternatively, 500 µA or 250 µA. The drive current $I_B$ is represented by units identified on the abscissa. The collector-to-emitter voltage $V_{CE}$ of the principal transistor 22 as a function of $I_B$ is represented by curves 1 and 2 in units identified on the left ordinate. With $I_{BIAS}$ set at 250 µA, $V_{CE}$ is shown by curve 1; for $I_{BIAS}$ at 500 µA, $V_{CE}$ is shown by curve 2. For reference, the current flowing through the parasitic resistance 33 is shown by curve 3 in units identified on the right ordinate. Also, for reference, the current flowing through the second parasitic transistor 34 is shown by curve 4 in units identified on the right ordinate. It readily can be observed that, as the base of the transistor 22 is driven with higher current, $V_{CE}$ attains a minimum at point 5 and starts increasing thereafter. The bottom of each of the curves 1 and 2 (i.e., its minimum) represents the points at which the second parasitic transistor 34 turns on. $V_{CE}$ begins to increase when the lateral second parasitic transistor 34 causes an increase in current flowing through the principal transistor 22.

For prior systems, the point at which phase inversion occurs cannot be predetermined, because the determining factors are process-dependent. Thus, systems are often designed for use so as to reduce the likelihood of phase inversion, by limiting the drive current. With this solution, however, the minimum attainable $V_{CE}$ is often higher than the minimum $V_{CE}$ which is actually attainable in the transistor. It is also impractical to design a system so that phase inversion is absolutely prevented. Such a design must handle all worst-case conditions, and may be unduly restrictive on normal operation.

Accordingly, it is an object of the present invention to allow activity of parasitic elements in a saturated bipolar transistor to be detected, thereby enabling prevention of phase inversion.

Another object of the present invention is to control the collector-to-emitter voltage of a saturated transistor.

It is another object of the present invention to minimize the collector-emitter voltage of a saturated transistor.

SUMMARY OF THE INVENTION

In view of the foregoing and other objects of the invention, there is provided an integrated circuit construction including a semiconductor substrate, a semiconductor layer and a desired bipolar transistor. First and second active parasitic elements are formed with the semiconductor substrate and layer. An element for detecting when the second parasitic transistor becomes active is also provided. This element may be an additional semiconductor region formed in the semiconductor layer. This element may also be responsive to current flowing through the second parasitic transistor to prevent phase reversal of the collector-to-emitter voltage of the main transistor.

In the preferred embodiment, the transistor is an NPN transistor formed in the semiconductor layer, which is this P-type. The element for detecting activity of the second parasitic transistor, or for preventing phase reversal, may comprise an N-type semiconductor region formed in the semiconductor layer between the N-type collector of the transistor and N-type substrate. If N-type junction isolation bands are used, for isolating the transistor from other circuit elements in the integrated circuit, the semiconductor region is formed between the collector and the isolation bands.

The present invention is well-suited for use in integrated circuits with complementary bipolar transistors. It may also be used with pnp transistors having a construction similar to the npn transistor described above. The present invention may also be used in the output stage of an operational amplifier.

DETAILED DESCRIPTION

Figure 6:
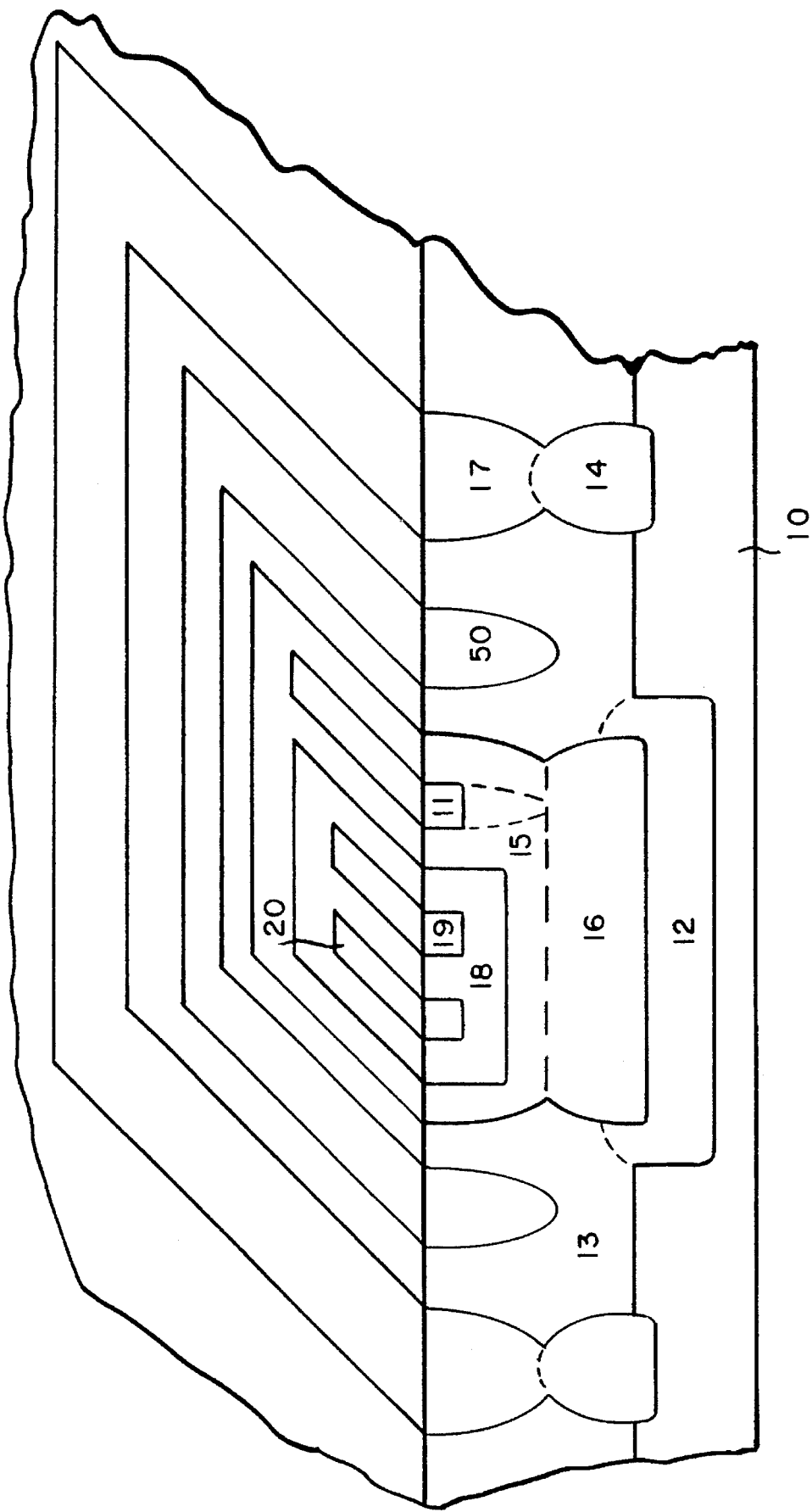
FIG. 6 is a partly isometric, partly cross-sectional view of an integrated circuit element embodying the present invention.
Figure 7:
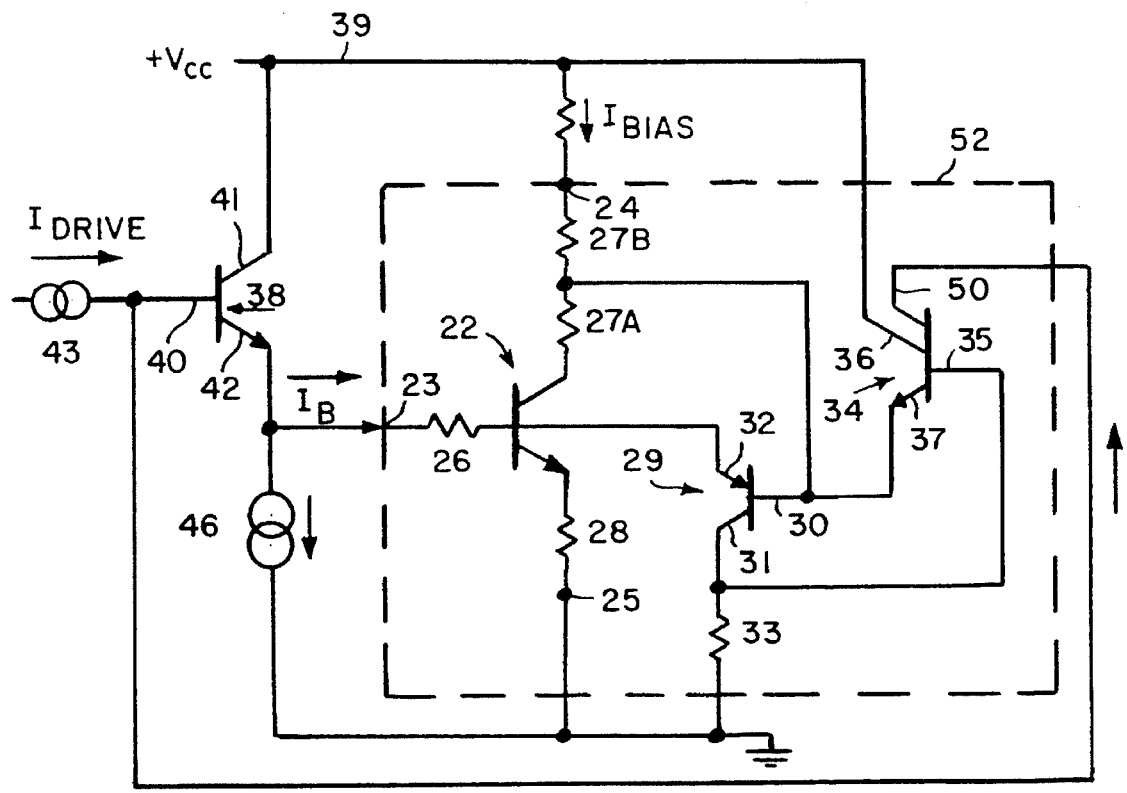
FIG. 7 is a schematic circuit diagram of an application using the present invention.
Figure 8:
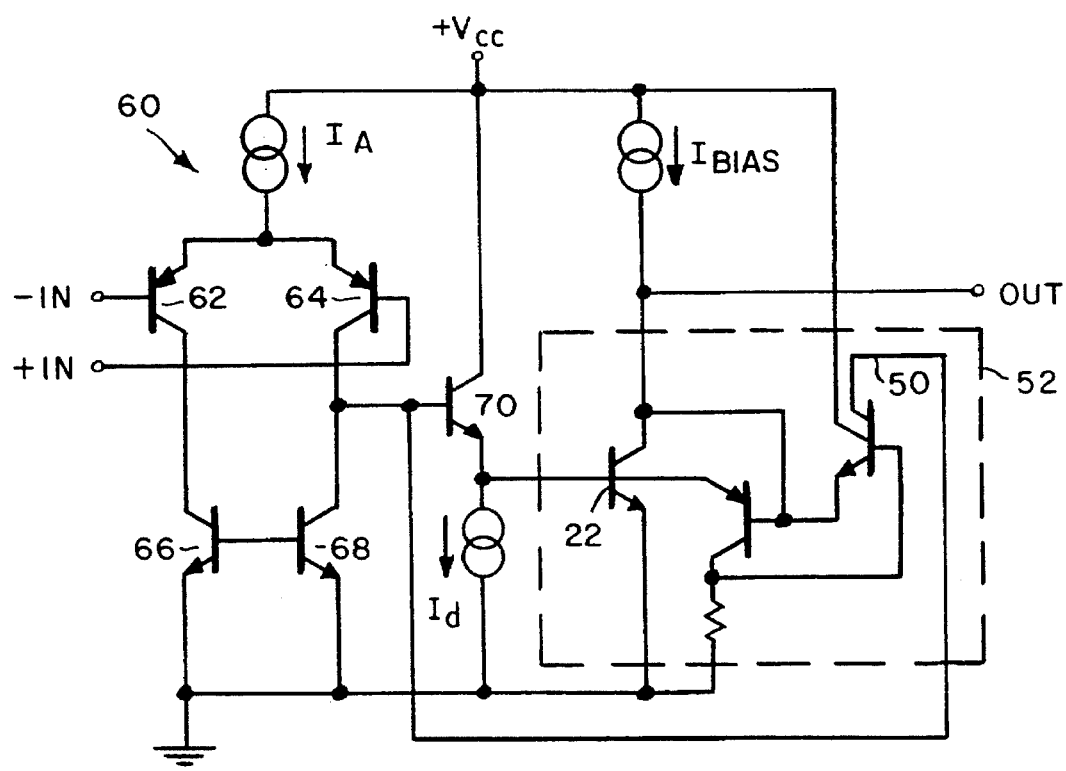
FIG. 8 is a schematic circuit diagram of an operational amplifier including an embodiment of the present invention.

A detailed description of embodiments of the present invention will now be provided in connection with FIGS. 6–8. Similar reference numbers in the figures indicate similar structures.

FIG. 6 illustrates an exemplary integrated circuit transistor element 52 embodying the present invention. This transistor element 52 may also be made according to a complementary bipolar process such as described in U.S. Pat. Nos. 4,969,823 and 5,065,214 which are hereby incorporated by reference. It is similar to the transistor element 8 of FIG. 1 in that it includes an N-type substrate 10, a P-well 12 and an epitaxial layer 13, N-type isolation bands 14 and 17; and a transistor including a base 18, a collector formed of regions 15 and 16, and an emitter 20. While an NPN transistor is shown for the purposes of illustration, it should be understood that the invention is applicable to PNP transistors also, with obvious interchanges of semiconductor types. Moreover, while the structure is shown for purposes of illustration, it should be understood that the invention is applicable in general to structures in which a transistor is formed in a layer of a first dopant type surrounded by junction isolation bands of a second dopant type. Transistors made according to other types of fabrication methods may also benefit from this construction.

Figure 1:
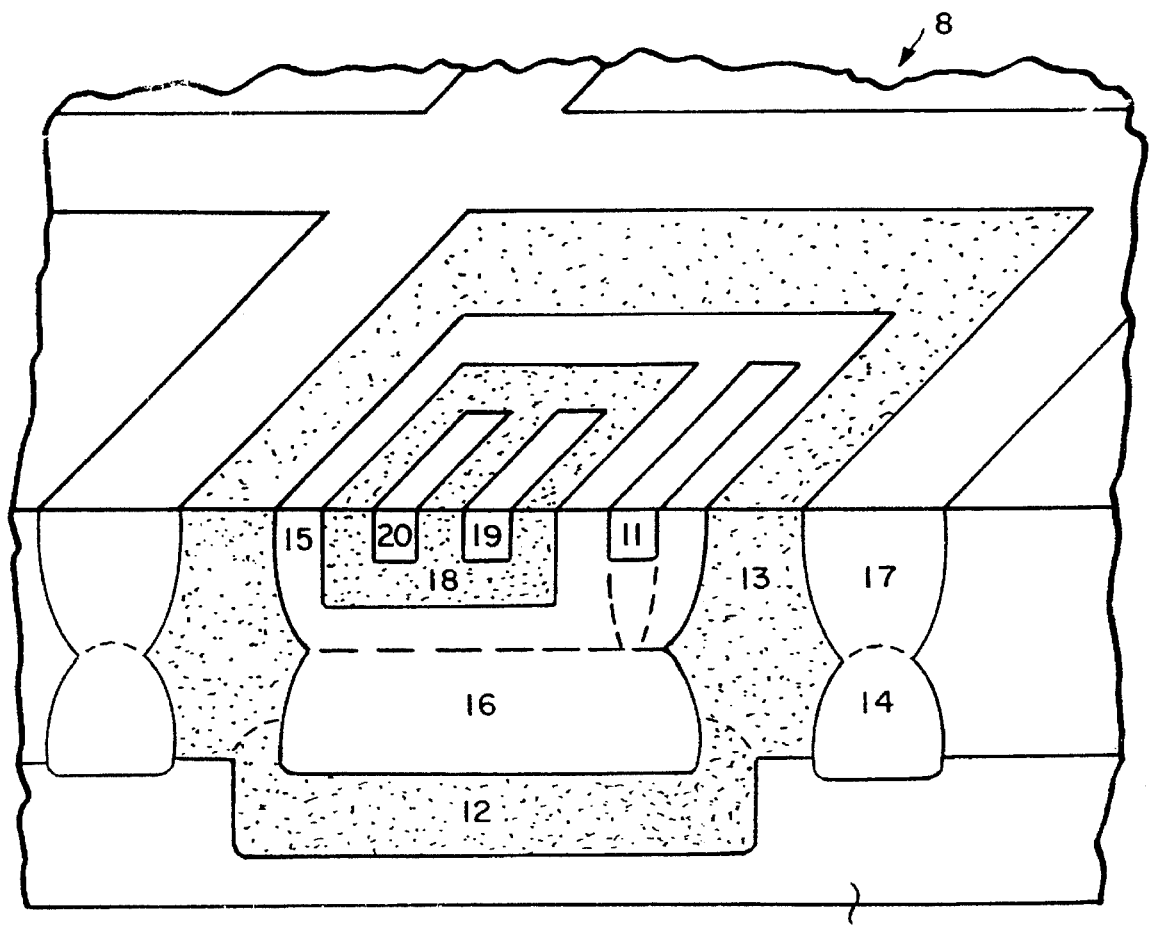
FIG. 1 is a partly cross-sectional, partly isometric view of an integrated circuit transistor element according to the prior art.
Figure 2:
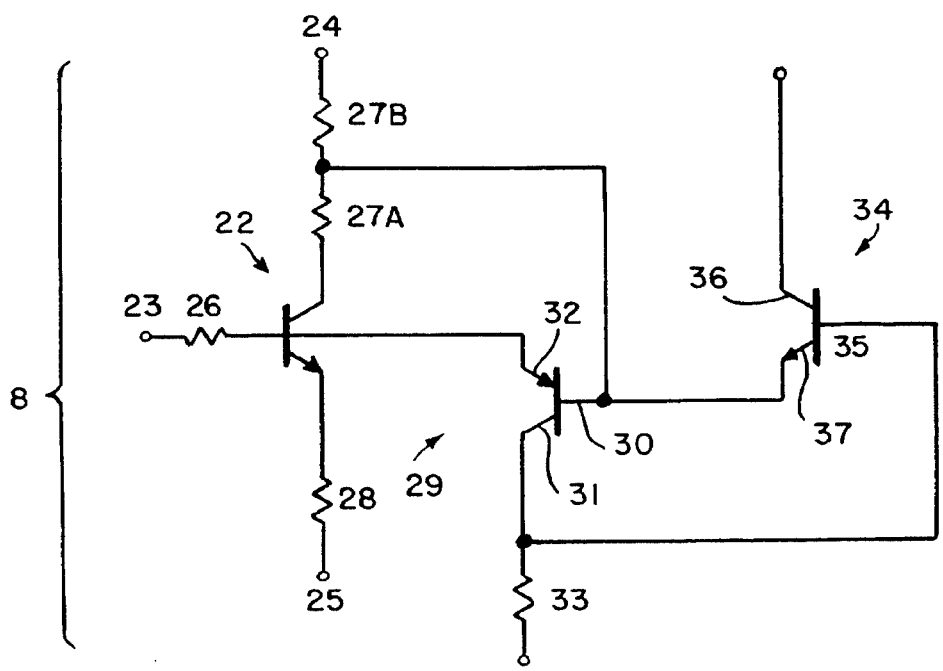
FIG. 2 is a schematic circuit diagram illustrating the parasitic transistors of the circuit element of FIG. 1.

The transistor element 52 of FIG. 6 further includes an additional N-type diffusion region 50 in the epitaxial layer 13 between the collector region 15 and 16 and isolation bands 14 and 17. In junction transistors isolated according to the prior art, such as shown in FIGS. 1 and 2, the junction isolation bands such as 14, 17 form the collector of a second parasitic transistor, as described above. In contrast, with the circuit as shown in FIG. 7, the additional diffusion region 50 acts as an additional collector in the second parasitic transistor, and may be used for control and detection purposes. In other words, an additional contact is provided with which the activity of the second parasitic transistor 34 may be detected.

Figure 3:
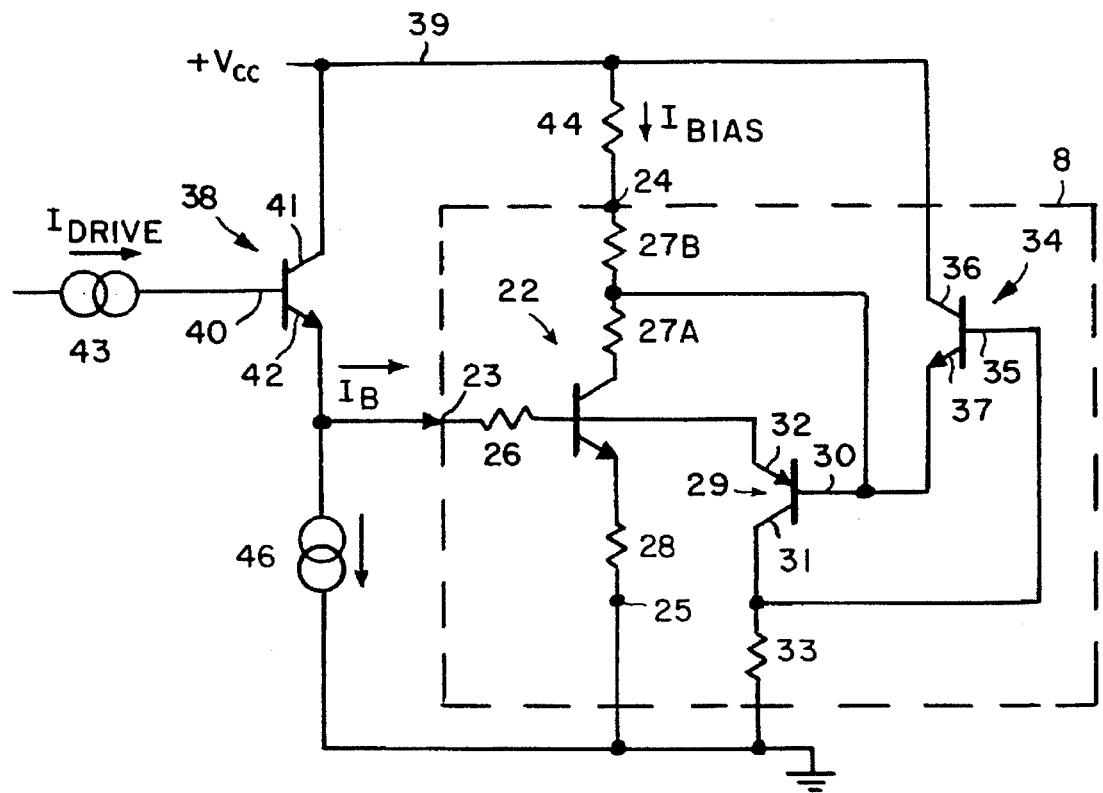
FIG. 3 is a schematic circuit diagram of a circuit in which the transistor of FIG. 1 may be used.
Figure 4:
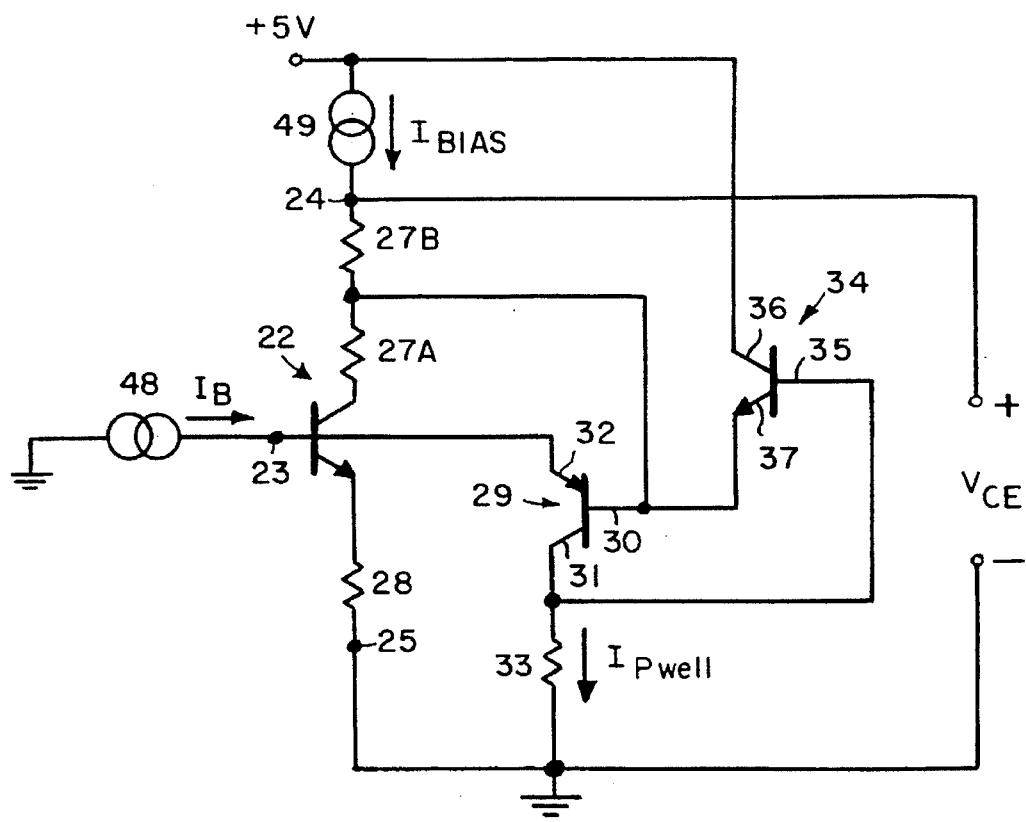
FIG. 4 is a schematic circuit diagram of a circuit for measuring the collector-to-emitter voltage of a transistor element as in FIG. 1.
Figure 5:
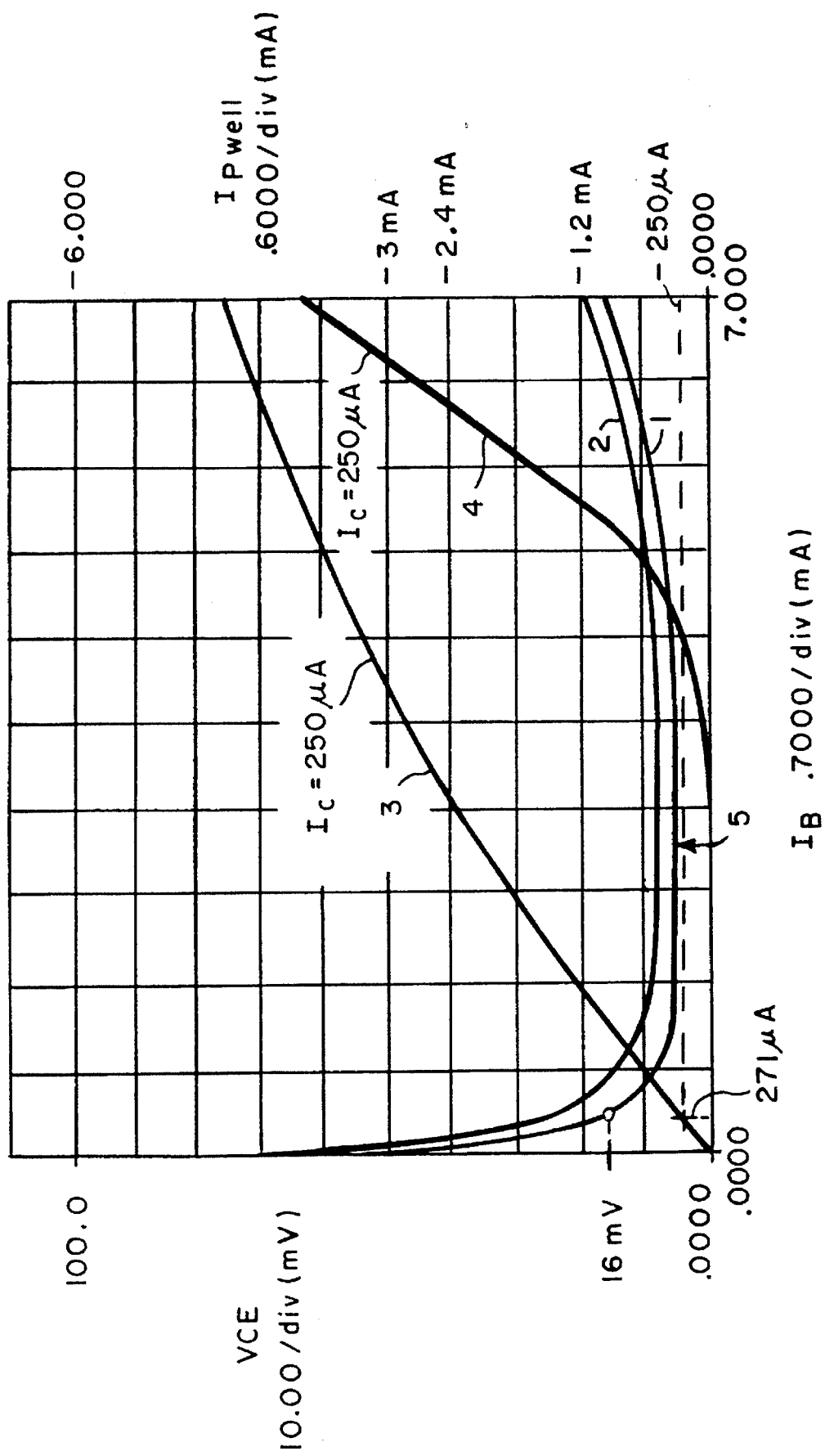
FIG. 5 is a graph of the collector-to-emitter voltage of the transistor element of FIG. 1 as a function of drive current as measured with the circuit of FIG. 4.

A transistor element 52 such as shown in FIG. 6 may be used in a circuit, such as described above in connection with FIG. 3, in the manner shown in FIG. 7. Numeral 52 in FIG. 7 identifies the schematic representation of the transistor element 52 of FIG. 6. In this circuit, the additional diffusion region 50 is connected to the current source 43. In this configuration, as the input drive current $I_{DRIVE}$ from source 43 increases, the current $I_B$ flowing to the base 23 of the transistor 52 increases. As $I_B$ increases, the principal transistor 22 eventually saturates and the first parasitic transistor 29 turns on as described above concerning the operation of the prior art. As the drive current $I_{DRIVE}$ increases further, thus increasing $I_B$ and driving transistor 52 further into saturation, the current flowing through the collector 31 of the first parasitic transistor 29 (i.e., the P-well 12 and epitaxial layer 13 in FIG. 5) increases. This current increases until the second parasitic transistor 34 turns on as described above concerning the operation of the prior art. When the second parasitic transistor 34 turns on, carriers flow from the collector 24 of the principal transistor (semi-conductor regions 15 and 16) to the base 35 of the second parasitic transistor 34 (regions 12 and 13 of FIG. 5) to the collector 36 of the second parasitic 34 (junction isolation bands formed by regions 14 and 17 of FIG. 5). The additional diffusion region 50 is connected to the current source 43 so that, when $I_B$ increases, this region 50 intercepts carriers flowing in the second parasitic transistor 34, which now operates under normal forward-active conditions. The current intercepted by region 50 acts to divert $I_{DRIVE}$ and thus prevent $I_B$ from further increasing. Since the current intercepted by region 50 is also responsible for increasing $V_{CESAT}$ of the principal transistor 22, as explained in connection with FIG. 5 above, use of this intercepted current to modulate $I_B$ maintains $V_{CESAT}$ at its minimum value.

A transistor element 52 such as shown in FIG. 6 is also particularly well-suited to use in the output stage of an operational amplifier, such as shown at 60 in FIG. 8. Such a construction for an operational amplifier is well known in the art. It includes two pnp transistors 62 and 64, respectively receiving first and second inputs at their respective bases. Their emitters are commonly connected to a current source $I_A$. Their collectors are each respectively connected to first and second npn transistors 66 and 68. The collector of transistor 68 drives the base of a third NPN transistor 70. The emitter of transistor 70 is connected to the base of the principal transistor 22 and a current source $I_d$. The output stage of the amplifier of FIG. 8 includes a transistor such as shown by element 52 in FIG. 6. The collector 24 of the principal transistor 22 provides the output of the operational amplifier 60. The additional diffusion region 50 (FIG. 6), which acts as a second collector in the second parasitic transistor 34, is also connected to the base of transistor 70° By minimizing $V_{CESAT}$ of the output transistor 52 of an operational amplifier as shown in FIG. 8, the swing voltage of the operational amplifier is maximized and a low output voltage is brought as close to GND as is possible.

The use of an additional diffusion region 50 to sense, detect and control saturation may be applied to other types of transistors than those shown and described. For example, the P-type and N-type regions as shown in FIG. 6 may be alternated to obtain a PNP transistor. Other types of transistors besides those made by complementary bipolar processes may also benefit from the present invention.

Having now described a number of embodiments of the present invention, it should be apparent to those skilled in the art that the foregoing is illustrative only and not limiting, having been presented by way of example only. Numerous other embodiments and modifications thereof are contemplated as falling within the scope of the present invention as defined by the appended claims and equivalents thereto.

What is claimed is:

1. An integrated circuit comprising:

a semiconductor substrate of a first dopant type;

a semiconductor layer of a second dopant type formed on the substrate;

a desired bipolar transistor formed in the semiconductor layer and electrically isolated from the substrate and having an emitter of the first dopant type, a base of the second dopant type, and a collector of the first dopant type, wherein the base receives a drive current, and wherein a difference of a first voltage at the collector and a second voltage at the emitter defines a collector-to-emitter voltage;

the base, the collector, and the semiconductor layer defining a first parasitic transistor;

the collector, the semiconductor layer, and the semiconductor substrate defining a second parasitic transistor which becomes active after the first parasitic transistor has become active and when the drive current reaches a predetermined level; and means, operative when the second parasitic transistor becomes active, for preventing an increase in the collector-to-emitter voltage in the desired bipolar transistor by preventing an increase in the drive current above the predetermined level.

2. The integrated circuit according to claim 1 wherein the means for preventing includes:

a semiconductor region of the first dopant typed formed in the semiconductor layer and disposed in an electrical path between the collector of the desired transistor and the substrate, wherein the semiconductor region intercepts carriers flowing in the second parasitic transistor when the second parasitic transistor becomes active; and a source of drive current coupled between the semiconductor region and the desired bipolar transistor, that provides the drive current to the base and that receives the carriers intercepted by the semiconductor region, wherein the said carriers control the source of drive current such that the drive current does not exceed the predetermined level.

3. The integrated circuit according to claim 2 wherein the source of drive current includes:

a drive bipolar transistor having a collector, a base, and an emitter, wherein the emitter of the drive bipolar transistor is coupled to the base of the desired bipolar transistor to provide the drive current, and the base of the drive bipolar transistor is coupled to the semiconductor region.

4. An operational amplifier integrated circuit having a first input to receive a first input signal, a second input to receive a second input signal, and an output to provide an output signal, the operational amplifier integrated circuit comprising:

a differential amplifier that receives the first input signal and the second input signal to provide an amplified differential signal that is an amplification of a difference of the first input signal and the second input signal;

a source of a drive current coupled to the differential amplifier, having an input that receives the amplified differential signal and an output that provides the drive current;

a transistor structure formed on a semiconductor substrate, having a first parasitic transistor and a second parasitic transistor, and an output transistor having a collector, a base, and an emitter, the base coupled to the output of the source of the drive current to receive the drive current, the collector coupled to the output of the operational amplifier integrated circuit to provide the output signal, wherein the second parasitic transistor becomes active after the first parasitic transistor has become active and when the drive current reaches a predetermined level; and means for intercepting carriers flowing in the second parasitic transistor when the second parasitic transistor becomes active, wherein the means for intercepting is connected to the source of the drive current and controls the source of the drive current with said carriers such that the drive current provided to the output transistor does not exceed the predetermined level.

5. The operational amplifier integrated circuit according to claim 4, wherein the means for intercepting includes:

a semiconductor region disposed in an electrical path between the collector of the output transistor and the semiconductor substrate.

6. A gain stage integrated circuit having an input that receives an input signal and an output that provides an output signal, the gain stage integrated circuit comprising:

a source of a drive current having an input that receives the input signal at the input of the gain stage integrated circuit and an output that provides the drive current; and a transistor structure formed on a semiconductor substrate and having a first parasitic transistor and a second parasitic transistor, and an output transistor having a collector, a base, and an emitter, the base coupled to the output of the source of the drive current to receive the drive current, the collector coupled to the output of the gain stage integrated circuit to provide the output signal of the gain stage integrated circuit, wherein the second parasitic transistor becomes active after the first parasitic transistor has become active and when the drive current reaches a predetermined level, and wherein the improvement comprises:

in the transistor structure, means for intercepting carriers flowing in the second parasitic transistor when the second transistor becomes active, said means for intercepting being connected to the source of the drive current, wherein the said carriers control the source of the drive current such that the drive current does not exceed the predetermined level.

7. An integrated circuit comprising:

a semiconductor substrate of a first dopant type;

a semiconductor layer of a second dopant type formed on the substrate;

a first transistor formed in the semiconductor layer and having an emitter of the first dopant type, a base of the second dopant type, and a collector of the first dopant type;

the base, the collector and the semiconductor layer defining a first parasitic element;

the collector, the semiconductor layer and the semiconductor substrate defining a second parasitic element;

a semiconductor region of the first dopant type formed in the semiconductor layer and disposed in an electrical path between the substrate and the collector of the first transistor; and a source of drive current having an input to receive an input signal and an output to provide the drive current in response to the input signal, the base of the transistor being connected to receive the drive current;

wherein the semiconductor region is connected to the input of said source of drive current to modulate said input and thereby control the output drive current and, in consequence, limit saturation of the transistor.

8. The integrated circuit as claimed in claim 7, wherein the source of drive current comprises a second transistor having a base, a collector and an emitter, the base of the second transistor being connected to the semiconductor region, and the emitter of the second transistor being connected to the base of the first transistor.

9. The integrated circuit as claimed in claim 8, wherein the semiconductor layer is an epitaxial layer of semiconductor material formed on the substrate, thereby forming with the substrate a composite structure having at least two semiconductor layers.

10. The integrated circuit as claimed in claim 9, wherein the semiconductor layer includes a well to isolate the collector of the first transistor from the substrate.

11. The integrated circuit as claimed in claim 10, further comprising junction isolation bands of the first dopant type and formed in the semiconductor layer to isolate the first transistor from other circuit elements in the integrated circuit.

12. The integrated circuit as claimed in claim 11, wherein the semiconductor region of the first dopant type is formed in the semiconductor layer and is disposed in an electrical path between the junction isolation bands and the collector of the first transistor.

13. The integrated circuit as claimed in claim 12, wherein the collector of the first transistor is formed on the semiconductor layer, the base is formed in the collector, and the emitter is formed in the base.

* * * * *